(12) United States Patent
Morche et al.

(10) Patent No.: US 9,344,107 B1
(45) Date of Patent: May 17, 2016

(54) CONTINUOUS TIME ADC AND FILTER

(71) Applicants: COMMISSARIAT A L'ENERGIE ATOMIQUE, Paris (FR); THE TRUSTEES OF COLUMBIA UNIVERSITY IN THE CITY OF NEW YORK, New York, NY (US)

(72) Inventors: Dominique Morche, Meylan (FR); Alin Ratiu, Grenoble (FR); Sharvil Pradeep Patil, New York, NY (US); Yannis Tsividis, New York, NY (US)

(73) Assignees: COMMISSARIAT A L'ENERGIE ATOMIQUE (FR); THE TRUSTEES OF COLUMBIA UNIVERSITY IN THE CITY OF NEW YORK, New York, NY (US)

( * ) Notice: Subject to any disclaimer, the term of this patent is extended or adjusted under 35 U.S.C. 154(b) by 0 days.

(21) Appl. No.: 14/738,129

(22) Filed: Jun. 12, 2015

(51) Int. Cl.
*H03M 3/00* (2006.01)
*H03M 1/12* (2006.01)
*H04B 1/10* (2006.01)

(52) U.S. Cl.
CPC ............... *H03M 3/32* (2013.01); *H03M 1/125* (2013.01); *H03M 3/344* (2013.01); *H03M 3/368* (2013.01); *H04B 1/10* (2013.01); *H04B 2001/1063* (2013.01)

(58) Field of Classification Search
CPC ...... H04B 1/10; H04B 1/1027; H04B 1/1036; H04B 1/12; H04B 1/123; H04B 2001/1045; H04B 2001/1063; H03M 1/06; H03M 1/0617; H03M 1/08; H03M 1/124; H03M 1/125; H03M 3/32; H03M 3/322; H03M 3/344; H03M 3/346; H03M 3/368
See application file for complete search history.

(56) References Cited

U.S. PATENT DOCUMENTS

| | | | | |
|---|---|---|---|---|
| 7,091,894 B2 * | 8/2006 | Fudge | ................. | H03M 1/0626 341/118 |
| 8,749,421 B2 * | 6/2014 | Kurchuk | ................ | H04R 25/00 341/155 |
| 8,760,330 B2 * | 6/2014 | Ritter | .................... | H03M 3/368 341/143 |
| 2008/0129569 A1 * | 6/2008 | Muhammad | .......... | H03M 3/344 341/155 |

OTHER PUBLICATIONS

Schell et al., A Continuous-Time ADC/DSP/DAC System With No Clock and With Activity-Dependent Power Dissipation, IEEE Journal of Solid-State Circuits, vol. 43, No. 11, Nov. 2008.*
Vezyrtzis et al., A Flexible, Event-Driven Digital Filter With Frequency Response Independent of Input Sample Rate, IEEE Journal of Solid-State Circuits, vol. 49, No. 10, Oct. 2014.*
Yee William Li et al., A Continuous-Time Programmable Digital FIR Filter, IEEE Journal of Solid-State Circuits, vol. 41, No. 11, Nov. 2006.*

* cited by examiner

*Primary Examiner* — Howard Williams
(74) *Attorney, Agent, or Firm* — Wilmer Cutler Pickering Hale and Dorr LLP

(57) ABSTRACT

The invention concerns an analog to digital conversion and filtering circuit comprising: an input for receiving an analog input signal; an asynchronous continuous-time analog to digital converter adapted to generate, based on the analog input signal, a digital continuous-time signal; a feedback path comprising a digital continuous-time filter adapted to generate a filtered signal to be combined with the analog input signal, the digital continuous-time filter being adapted to generate the filtered signal by: filtering out at least one first frequency range of the digital continuous-time signal; and amplifying at least one second frequency range of the digital continuous-time signal.

14 Claims, 3 Drawing Sheets

CONTINUOUS TIME ADC AND FILTER

FIELD OF THE DISCLOSURE

The present disclosure relates to the field of analog to digital converters, and in particular to the field of continuous-time analog to digital converters.

BACKGROUND

Wireless receivers, such as the ones provided in mobile telephones, generally comprise an analog to digital converter (ADC) that converts the received signal into a digital signal that can be processed by a digital signal processor or the like. The analog to digital conversion is often performed using a discrete-time technique according to which the received signal is sampled at a sampling frequency fs, and then the samples are processed using an ADC such as a ΣΔ ADC. In order to reduce the operating frequency of the ADC, decimation may be applied to the analog samples before applying the digital conversion.

FIG. 1A is a graph illustrating an example of such an analog to digital conversion based on an input analog voltage signal 102. The signal 102 initially has a generally sinusoidal form, and then its amplitude drops to a low level close to zero. As represented by dots 104 in FIG. 1A, the signal 102 is sampled at time intervals ts, where ts=1/fs, fs being the sampling frequency. The voltage level of each sample is then for example converted into a digital value by selecting a closest level of quantization, each level of quantization having a corresponding digital value. The sampling continues even when the input signal falls close to zero, and thus the power consumed by the ADC remains at a constant level. Thus a drawback of performing such discrete-time analog to digital conversion is that it is has relatively high power consumption when the wireless transmission is sparse in the time domain. A further drawback of this type of analog to digital conversion is that sampling the signal at the sampling frequency fs risks bringing out-of-band interferers into the signal band, and thus an antialiasing filter is generally required to remove such interferers before sampling.

To address these drawbacks, a continuous-time analog to digital conversion method has been proposed. For example, such a method is described in the publication by B. Schell et al. entitled "A Continuous-Time ADC/DSP/DAC System With No Clock and With Activity-Dependent Power Dissipation", IEEE Journal of Solid-State Circuits, Vol. 43, No. 11, November 2008, the contents of which is hereby incorporated by reference.

FIG. 1B is a graph illustrating an example of continuous-time analog to digital conversion, based on the same input voltage signal 102 as in FIG. 1A. As illustrated, an output continuous-time digital signal is generated, which for example has one of a limited number of levels, there being seven levels illustrated by horizontal dashed lines in the example of FIG. 1B. A threshold voltage is for example defined at the mid-point between each pair of adjacent levels, and each time the input signal passes one of the threshold voltages, the level of the output signal switches levels accordingly.

It can be seen that when the input signal falls to zero, threshold voltages are no longer crossed by the input signal, and thus the output signal remains at a constant level, leading to very low power consumption. Furthermore, because the input signal is not sampled at a fixed time interval, aliasing is no longer an issue, and thus an anti-aliasing filter is not required.

The analog to digital conversion technique represented by FIG. 1B is referred to herein as a "continuous-time" technique because the input signal is not sampled at fixed time intervals, but rather the input signal is continually monitored. Furthermore, this conversion technique is asynchronous, because the output signal may switch from one level to another at any time based on the level of the input signal.

While such a continuous-time ADC consumes low power while the input signal is sparse in the time domain, the consumption can be high when high activity signals such as sinusoids are present. This is a configuration very often encountered by radio back-ends where the useful signal can be corrupted by high power interferers. There is thus a need in the art for an analog to digital converter having low power consumption even in the presence of such interferers.

SUMMARY

Embodiments of the present description at least partially address one or more needs in the prior art.

According to one aspect, there is provided an analog to digital conversion and filtering circuit comprising: an input for receiving an analog input signal; an asynchronous continuous-time analog to digital converter adapted to generate, based on the analog input signal, a digital continuous-time signal; a feedback path comprising a digital continuous-time filter adapted to generate a filtered signal to be combined with the analog input signal, the digital continuous-time filter being adapted to generate the filtered signal by: filtering out at least one first frequency range of the digital continuous-time signal; and amplifying at least one second frequency range of the digital continuous-time signal.

According to one embodiment, the digital continuous-time filter is a digital continuous-time FIR (finite impulse response) filter.

According to one embodiment, the first frequency range comprises a channel to be received.

According to one embodiment, the digital continuous-time filter receives a channel selection signal indicating the channel to be received, wherein the digital continuous-time filter is adapted to have a variable frequency response in order to select the channel to be received.

According to one embodiment, the digital continuous-time filter is a notch filter having a stop band equal to the first frequency range.

According to one embodiment, the frequency range of stop band of the notch filter is variable.

According to one embodiment, the digital continuous-time filter comprises at least one delay element for delaying the digital continuous-time signal to generate a plurality of signals of variable delay, and a plurality of elements for multiplying the plurality of signals of variable delay by corresponding coefficients.

According to one embodiment, the input signal comprises first and second differential input signals, and the asynchronous continuous-time analog to digital converter comprises: a first capacitor adapted to generate a first integrated signal by integrating the first input signal during a first phase and by integrating the second input signal during a second phase; a first comparator adapted to generate a first pulse when the first integrated signal passes a threshold level; a second capacitor adapted to generate a second integrated signal by integrating the second input signal during the first phase and by integrating the first input signal during a second phase; a second comparator adapted to generate a second pulse when the second integrated signal passes the threshold level; and a control circuit adapted to select the first or second phase based on a detection of the first or second transition.

According to one embodiment, the asynchronous continuous-time analog to digital converter further comprises a differential transconductance circuit adapted to amplify the first and second differential input signals prior to the integration by the first and second integrators.

According to one embodiment, the circuit further comprises a signal adaptation circuit adapted to convert the digital feedback signal into first and second differential analog feedback signals, and to combine the differential analog feedback signals with the analog input signal by coupling the first differential analog feedback signal to the first capacitor and the second differential analog signal to the second capacitor during the first phase, and by coupling the second differential analog feedback signal to the first capacitor and the first differential analog signal to the second capacitor during the second phase.

According to one embodiment, the circuit further comprises a sign adjustment circuit adapted to apply a positive sign to the first and second pulses generated based on an integration of the first analog input signal and to apply a negative sign to the first and second pulses generated based on an integration of the second analog input signal.

According to one embodiment, the filtered signal is a digital signal.

According to one embodiment, the filtered signal is an analog signal, the digital continuous-time filter generates a digital filtered signal and comprises a digital to analog converter for converting the digital filtered signal into the analog filtered signal.

According to a further aspect, there is provided a method of analog to digital conversion comprising: receiving at an input of an analog to digital conversion circuit an analog input signal; generating, by an asynchronous continuous-time analog to digital converter based on the analog input signal, a digital continuous-time signal; generating, by a feedback path comprising a digital continuous-time filter, a filtered signal, wherein the filtered signal is generated by: filtering out at least one first frequency range of the digital continuous-time signal; and amplifying at least one second frequency range of the digital continuous-time signal; and combining the filtered signal with the analog input signal.

BRIEF DESCRIPTION OF THE DRAWINGS

The foregoing and other features and advantages will become apparent from the following detailed description of embodiments, given by way of illustration and not limitation with reference to the accompanying drawings, in which.

DETAILED DESCRIPTION

Figure 1A:
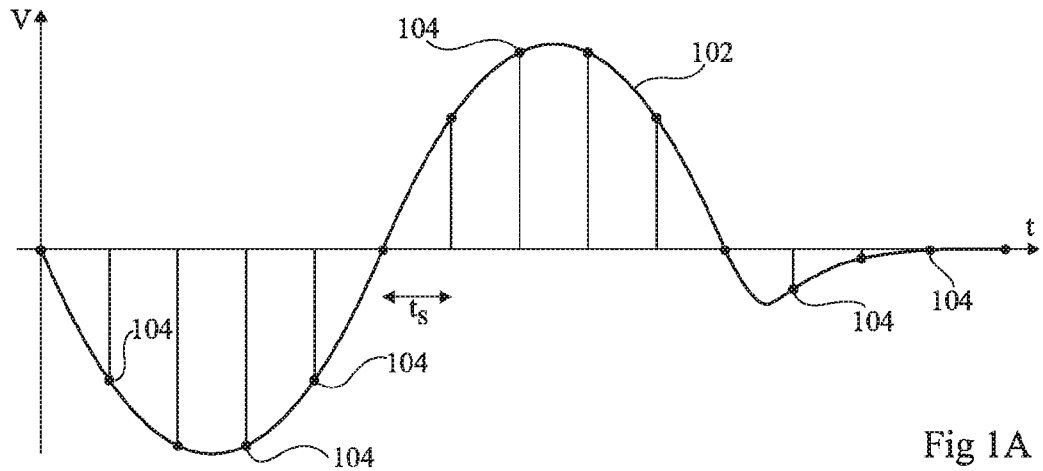
FIG. 1A (described above) is a graph illustrating an example of analog to digital conversion according to a discrete time technique.
Figure 1B:
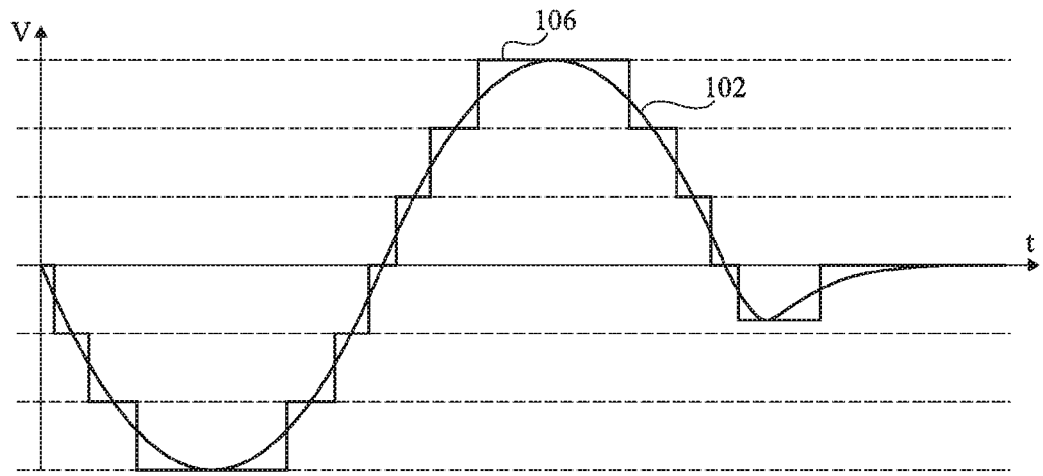
FIG. 1B (described above) is a graph illustrating an example of analog to digital conversion according to a continuous-time technique.

Throughout the present specification, the following terms will be given the following definitions:

"Analog signal": a signal that varies with time in a continuous manner, the signal 102 of FIGS. 1A and 1B providing an example;

"Digital signal": a signal that transitions between levels of a limited set of discrete levels, referred to herein as quantization levels. The signal may be composed of samples taken at regular intervals, like the signal 104 of FIG. 1A, or may change between levels at any moment, like the quantified signal 106 of FIG. 1B. The transitions between the levels may be instantaneous, or they may involve the signal going through each intermediate value between the levels. In the latter case, the transition time of each transition does not, for example, exceed 5 percent of the shortest period at which the signal is at any of the levels;

"Sampled signal" or "discrete-time signal": a signal composed of a sequence of values, generally corresponding to samples taken at regularly spaced time intervals defined by a sampling frequency;

"Continuous-time signal": a signal that is continuous in time, meaning that it is a function of a continuous argument, and is not sampled. It may change value at any moment in time, whether it is an analog signal or a quantified digital signal.

The term "substantially" is used herein to indicate a tolerance of +/−10 percent of the value in question.

While embodiments have been described herein in the context of an analog to digital converter of a wireless receiver, it will be apparent to those skilled in the art that the techniques described herein could be applied to other types of device requiring analog to digital conversion.

Figure 2A:
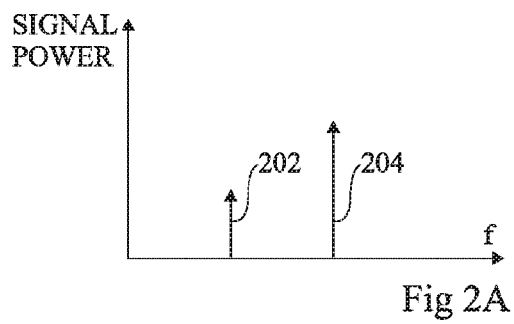
FIGS. 2A and 2B are spectral diagrams respectively illustrating an example of frequency components, before and after analog to digital conversion, of a received signal comprising a useful signal and an interferer.

FIG. 2A is a spectral diagram illustrating an example of the frequency components of an input signal, received for example by a wireless receiver. The input signal comprises a useful signal 202 at a first frequency and an interferer 204 at a frequency higher than that of the useful signal. In this example, the interferer 204 has a higher signal power than the useful signal.

Figure 2B:
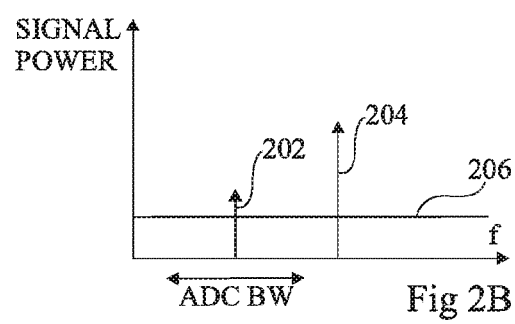

FIG. 2B is a spectral diagram illustrating an example of the frequency components of the input signal of FIG. 2A after analog to digital conversion. To avoid the interferer overloading the ADC and degrading its output in-band noise floor, techniques such as pre-ADC filtering or an over-specification of the ADC are generally used in order to limit the bandwidth of the ADC (ADC BW) and thus filter out the interferer. However, both of these solutions tend to consume relatively high power. Furthermore, a line 206 in FIG. 2B represents a constant noise power present at the output of the ADC, due to quantization noise in the case of sampled ADCs, and to internal component noise in the case of sampled and continuous time ADCs. While an automatic gain control block could be used to boost the signal power in order to improve the output signal to noise ratio (SNR), when a two tone input signal is present, one of the tones being a strong interferer like the one 204, then the maximum gain that may be applied by the automatic gain control block is limited by the ADC dynamic range, and thus the SNR is also limited.

Figure 3A:
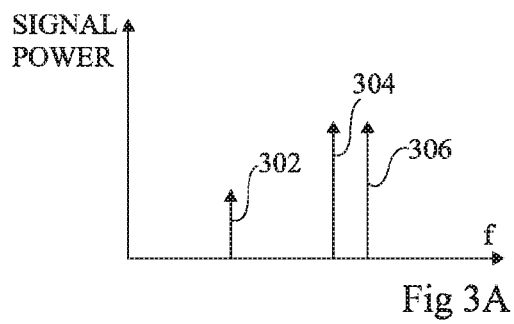
FIGS. 3A and 3B are spectral diagrams respectively illustrating an example of frequency components, before and after analog to digital conversion, of a received signal comprising a pair of useful signals and an interferer.

FIG. 3A is spectral diagram showing another example in which an input signal has frequency component comprising a useful signal 302 at a first frequency, a first interferer 304 at a frequency higher than that of the useful signal, and a second interferer 306 at a frequency higher than that of the first interferer. Both of the interferers 304, 306 for example have a signal power greater than that of the useful signal 302.

Figure 3B:
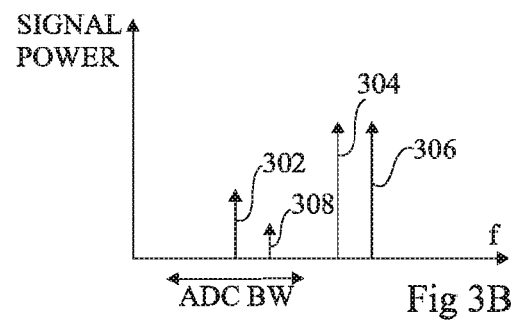

FIG. 3B is a spectral diagram illustrating an example of the frequency components of the input signal of FIG. 3A after analog to digital conversion. Since the analog to digital conversion is, by nature, a nonlinear process, 3rd order intermodulation products are created, one example of which is shown labelled 308 in FIG. 3B. One or more intermodulation products may fall within the bandwidth of the ADC, like in the example of FIG. 3B, and degrade the signal to noise and distortion ratio (SNDR), which is a measure of conversion quality. Moreover, the presence of strong interferers at the input of a CT-ADC makes it generate a large number of transitions on the signal 106, thereby increasing its power consumption. This increased power consumption also extends to the blocks situated after the CT-ADC, such as to a block 416 of FIG. 4 discussed below.

Figure 4:
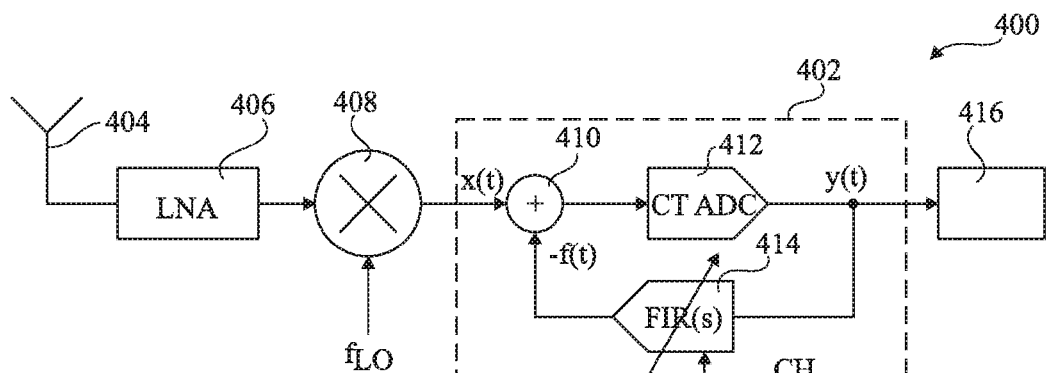
FIG. 4 schematically illustrates a continuous-time ADC with filter according to an example embodiment of the present disclosure.

FIG. 4 schematically illustrates a wireless reception system 400 comprising an asynchronous continuous-time analog to digital converter (ADC) and filtering circuit 402.

The system 400 for example comprises an antenna 404, via which a wireless signal is received, and a low noise amplifier (LNA) 406 coupled to the antenna 404 for amplifying received signal. The output of the LNA 406 is coupled to one input of a mixer 408, which receives at another input a signal $f_{LO}$ generated for example by a local oscillator (not illustrated in FIG. 4). The mixer 408 for example mixes the received signal with the frequency signal $f_{LO}$ to down-convert the received signal to generate a signal x(t) at an intermediate frequency band IF. The signal x(t) is an analog signal, which is provided to the asynchronous continuous-time ADC and filtering circuit 402.

The circuit 402 for example comprises a subtractor 410, which receives the analog signal x(t), and subtracts from it a feedback signal f(t). This operation is equivalent to using an adder to add a negative version −f(t) of the feedback signal to the input signal x(t).

The output of the subtractor 410 is coupled to a continuous-time ADC (CT ADC) 412, which generates, at its output, a digital continuous-time signal y(t). The output of the CT ADC 412 is also coupled to a feedback path comprising a digital continuous-time filter 414, which generates the feedback signal f(t). In the example of FIG. 4, the filter 414 is a digital continuous-time FIR (finite impulse response) filter, although in alternative embodiments other types of digital continuous-time filters could be used. The output signal y(t) is a digital signal, and therefore, ignoring transitions, it occupies a finite set of values in the amplitude domain. The continuous-time filter 414 is for example a digital filter that applies coefficients also represented by the finite set of values in the amplitude domain. The result is that the feedback signal f(t) is also for example a digital signal having a finite set of values in the amplitude domain. However, in some embodiments the feedback signal f(t) is an analog signal. For example, the digital continuous-time filter 414 generates a digital filtered signal and comprises a DAC (digital to analog converter) for converting the digital filtered signal into the analog feedback signal f(t). For example, in some embodiments, the DAC has a low bandwidth and/or is combined with a low pass filter, leading to a smoothing of the transitions of the digital filtered signal.

The digital CT filter 414 is for example a low pass filter, high pass filter, band pass filter or notch filter. Furthermore, in the example of FIG. 4, the filter 414 is tuneable, implying that the position and/or width of its pass band or stop band is variable. In the case that its frequency response is variable, the filter for example receives a channel selection signal CH and varies its frequency response to perform channel selection, as will be described in more detail below. However, in alternative embodiments, the filter 414 could have a fixed frequency response.

The output of the filter 414 is coupled to the subtractor 410. The filter 414 for example generates the feedback signal f(t), which is subtracted by the subtractor 410 from the input signal x(t) of the circuit 402.

The output signal y(t) of the circuit 402 is also for example provided to a further processing circuit 416, which for example represents a baseband processor of the wireless receiver, or other type of circuit. In some embodiments, the continuous time signal y(t) is converted into binary digital values prior being processed by the baseband processor, for example by using a counter to count the periods between consecutive level crossings, and then generating, by a digital signal processor (DSP) the binary digital values based on the digital amplitude values of the continuous time signal and based on the count values.

In operation, the filter 414 is for example adapted to filter out at least one first frequency range of the digital continuous-time signal y(t) containing the useful signal, and to amplify at least one second frequency range of the digital continuous-time signal likely to contain interferers. Thus, by then subtracting this signal from the analog input signal, frequency components that are not in the first frequency range will be attenuated from the input signal x(t) prior to the analog to digital conversion.

Figure 5:
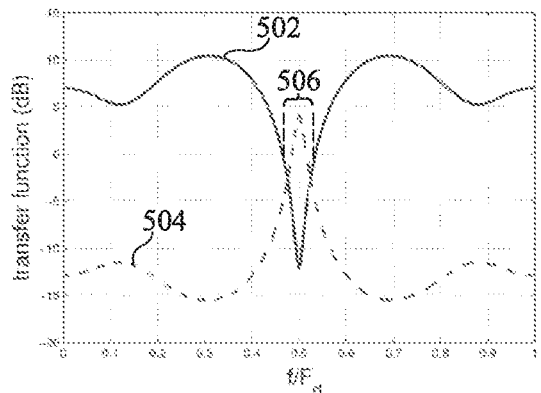
FIG. 5 is a graph illustrating the transfer function of an FIR filter and of the converter of FIG. 4 according to an example embodiment of the present disclosure.

FIG. 5 is a graph representing, by a solid curve 502, an example of the transfer function of the filter 414, and by a dashed curve 504, the transfer function of the circuit 402 of FIG. 4. The y axis represents the transfer function in dB, and the x axis represents the ratio of the frequency f divided by the frequency $F_d=1/T_d$, where $T_d$ is the tap delay of the FIR filter. In the case that $T_d$ is not constant, $F_d$ is for example equal to the least common multiple of the set of different $T_d$ values.

As illustrated by the curve 502, the FIR filter forms a band stop filter, also known as a notch filter, which amplifies frequency bands outside of the stop band. Frequencies within the stop band are for example not amplified at all, or attenuated. Thus the stop band for example corresponds to a frequency range 506 in FIG. 5 within which the filter applies zero or negative gain. More generally, the stop band can be defined as the frequency range for which an attenuation of at least 3 dB is applied with respect to the highest gain.

As illustrated by the curve 504, the transfer function of the filter 414 leads to an overall transfer function of the circuit 402 by which signals outside of the stop band of the filter are heavily attenuated. Thus interferers occurring outside this frequency band will be suppressed.

The bandwidth of the stop band 506 of the filter 414, and its particular frequency limits, will depend on the particular frequency band of the useful signal.

It will be apparent to those skilled in the art that, depending on the likely interferer frequencies, it might be possible in some embodiments to use a high pass or low pass filter to implement the filter 414, rather than a notch filter.

In some embodiments, the digital continuous-time filter 414 is for example variable in order to provide channel selection based on the channel selection signal CH represented in FIG. 4, as will now be described in relation to FIG. 6.

Figure 6:
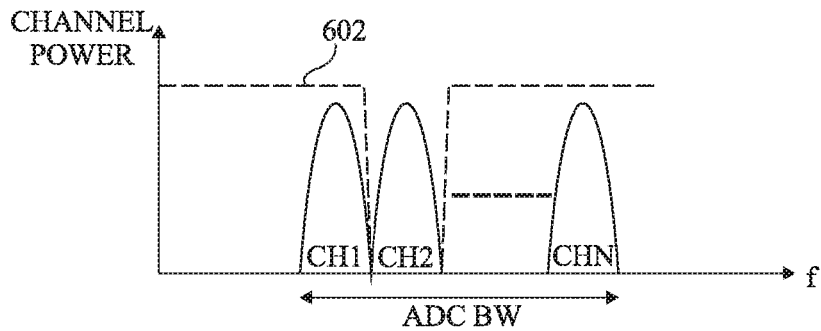
FIG. 6 is a spectral diagram illustrating channel selection using the continuous-time ADC of FIG. 4 according to an example embodiment.

FIG. 6 is a spectral diagram illustrating channel power of N channels CH1 to CHN of the input signal x(t) of the ADC circuit 402 of FIG. 4. The bandwidth (ADC BW) of the analog to digital converter for example covers the plurality N of channels, where N is an integer equal to 2 or more.

The stop band of the filter 414 for example has a bandwidth substantially equal to the channel bandwidth of each channel CH1 to CHN, and is for example aligned with the frequency of one of the channels in order to select that channel. For example, in order to select the channel CH2, the filter 414 has the characteristics as represented by the dashed line 602 in FIG. 6, such that all of the channels except the channel CH2 are suppressed in the analog input signal x(t).

Figure 7:
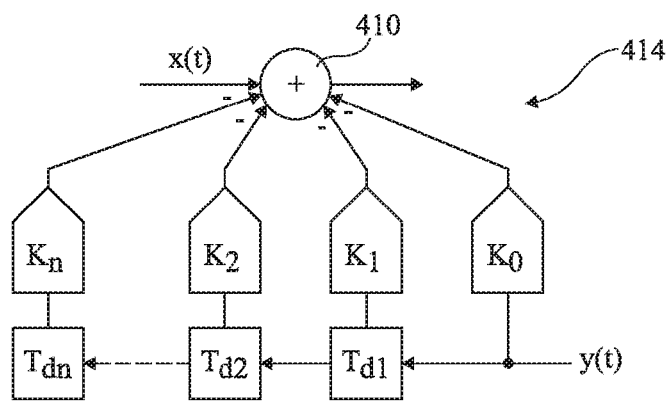
FIG. 7 schematically illustrates a continuous time FIR filter of the continuous-time ADC of FIG. 4 in more detail according to an example embodiment of the present disclosure.

FIG. 7 illustrates the filter 414 in more detail according to an example in which it is implemented by an FIR filter.

As illustrated, the continuous-time digital signal y(t) is for example delayed by a chain of n delay elements respectively introducing time delays $T_{d1}$ to $T_{dn}$. The signal y(t) is multiplied by a first coefficient $K_0$. The signals at the outputs of the delay elements $T_{d1}$ to $T_{dn}$ are respectively multiplied by coefficients $K_1$ to $K_n$ respectively. These products together form the feedback signal f(t), which is subtracted from the input signal x(t) by the subtractor 410.

The time delays $T_{d1}$ to $T_{dn}$, and the coefficients $K_0$ to $K_N$, depend for example on the particular frequency range of the useful signal. As one specific example, choosing $T_d$, for all n, equal to 100 ns, and thus a frequency $F_d$ of 10 MHz, a pass band filter centred at around 5 MHz can be achieved by coefficients $K_0$=0.75, $K_1$=0.5, $K_2$=−0.5 and $K_3$=0.25.

In the case that the frequency range of the stop band of the filter 414 is variable in order to perform channel selection, the coefficients $K_0$ to $K_n$ and/or the tap delays $T_{d1}$ to $T_{dn}$ are for example altered in order to shift the channel selection. For example, a lookup table in the filter 414 (not illustrated) outputs, for any selected channel among the available channels CH1 to CHN, a set of corresponding values of the coefficients $K_0$ to $K_n$, and/or a set of control signals for achieving the tap delays $T_{d1}$ to $T_{dn}$, in order to program the filter to perform the desired channel selection.

The filter of FIG. 7 is merely one example. Alternatively, the filter 414 could be implemented by the circuit described in a publication by Christos Vezyrtzis entitled "A Flexible, Event-Driven Digital Filter With Frequency Response Independent of Input Sample Rate", IEEE JOURNAL OF SOLID-STATE CIRCUITS, VOL. 49, No. 10, OCTOBER 2014, the contents of which is hereby incorporated by reference. Alternatively, the filter 414 corresponds to the FIR filter described in the publication by Yee William Li et al, entitled "A Continuous-Time Programmable Digital FIR Filter", IEEE JOURNAL OF SOLID-STATE CIRCUITS, VOL. 41, No. 11, NOVEMBER 2006, the contents of which is hereby incorporated by reference.

Figure 8:
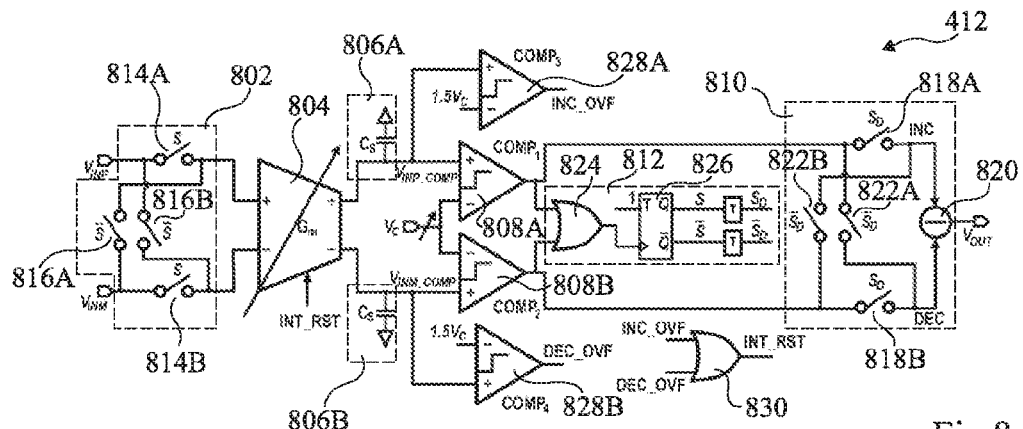
FIG. 8 schematically illustrates the continuous-time ADC of FIG. 4 in more detail according to an example embodiment of the present disclosure.

FIG. 8 schematically illustrates the asynchronous continuous-time analog to digital converter 412 of FIG. 4 in more detail according to an example embodiment. A similar circuit is for example described in the US provisional application assigned Ser. No. 62/012,843 entitled "An asynchronous flipping sigma-delta-like modulator", filed Jun. 16, 2014, the contents of which is hereby incorporated by reference.

The embodiment of FIG. 8 assumes a differential implementation in which the input signal x(t) is formed of differential input signals $V_{INP}$ and $V_{INM}$. These differential signals are provided to an input switching circuit 802, which applies the differential input signals $V_{INP}$ and $V_{INM}$ to differential inputs of a differential transconductance circuit 804, which for example has a variable gain. In particular, the input switching circuit 802 applies, based on control signals S and $\overline{S}$, either the signal $V_{INP}$ to the positive input of the transconductance circuit 804 and the signal $V_{INM}$ to the negative input of the transconductance circuit 804, or the signal $V_{INM}$ to the positive input of the transconductance circuit 804 and the signal $V_{INP}$ to the negative input of the transconductance circuit 804.

The positive output of the transconductance circuit 804 is then integrated on a capacitor 806A to provide a signal $V_{INP\_COMP}$. This signal is then compared by a comparator 808A with a reference voltage level $V_C$ to generate a signal $COMP_1$ at the output of comparator 808A. Similarly, the negative output of the transconductance circuit 804 is then integrated on a capacitor 806B to provide a signal $V_{INM\_COMP}$. This signal is then compared by a comparator 808B with the reference voltage level $V_C$ to generate a signal $COMP_2$ at the output of comparator 808B. The voltage level $V_C$ is for example variable. The outputs of the comparators 808A and 808B are provided to a sign correction circuit 810, and to a control circuit 812.

The control circuit 812 generates the signal S and $\overline{S}$ for controlling the input switching circuit to flip the signals $V_{INP}$ and $V_{INM}$ when the output of either of the comparators 808A, 808B goes high. This causes the corresponding output signal $COMP_1$, $COMP_2$ to go low, and thus form a pulse. The sign correction circuit 810 corrects the sign of the pulses generated by the comparators 808A, 808B based on whether they are generated by the signal $V_{INP}$ or $V_{INM}$.

The input switching block 802 for example comprises a switch 814A coupling the input node receiving the input signal $V_{INP}$ to the positive input of the transconductance circuit 804, and a switch 814B coupling the input node receiving the input signal $V_{INM}$ to the negative input of the transconductance circuit 804. The input switching block 802 also for example comprises a switch 816A coupling the node receiving the input signal $V_{INM}$ to the positive input of the transconductance circuit 804, and a switch 816B coupling the node receiving the input signal $V_{INP}$ to the negative input of the transconductance circuit 804. The switches 814A and 814B are controlled by signal S, and the switches 816A and 816B are controlled by the signal $\overline{S}$.

In the example of FIG. 8, the integrators 806A and 806B each comprise a capacitor having a capacitance $C_S$ coupled between the corresponding outputs of the amplifier stage 804 and ground.

The sign correction circuit 810 for example comprises a switch 818A coupled between the output of comparator 808A and a positive input of a subtractor 820, and a further switch 822A coupled between the output of comparator 808A and a negative input of the subtractor 820. Similarly, the sign correction circuit 810 for example comprises a switch 818B coupled between the output of comparator 808B and the negative input of the subtractor 820, and a further switch 822B coupled between the output of comparator 808B and the positive input of the subtractor 820. The switches 818A and 818B are controlled by a signal $S_D$, and the switches 822A and 822B are controlled by a signal $\overline{S_D}$. The subtractor 820 generates an output signal $V_{OUT}$ by The signal $S_D$ and $\overline{S_D}$ are for example generated by the control circuit 812. This control circuit 812 for example comprises an OR gate 824 having its inputs coupled to the outputs of the comparators 808A and 808B respectively. The output of the OR gate is coupled to the clock input of a device 826, which is for example a D-type flip-flop, the output of which transitions each time the output of the OR gate 814 goes high. The device 826 has Q and $\overline{Q}$ outputs respectively providing the control signals S and $\overline{S}$. Furthermore, each of the outputs of the device 826 are coupled to a delay elements (T), which generate respectively the signals $S_D$ and $\overline{S_D}$.

In some embodiments, further comparators 828A and 828B are provided for comparing the signal at the positive and negative outputs of the differential transconductance circuit 804 with a reference voltage, equal for example to substantially 1.5 times the reference voltage $V_C$. The signals $V_{INP\_COMP}$ and $V_{INM\_COMP}$ should remain within the bounds of $+/-V_C$, and these comparators 828A, 828B, which may be omitted in some embodiments, verify that these signals do not go outside the bounds defined by $+/-m.V_C$, where m is equal to 1.5 in the example of FIG. 9. The outputs of the comparators 828A and 828B are provided to corresponding inputs of an OR gate 830, which provides a reset signal INT_RST to the transconductance circuit 804 when either of the threshold levels is exceeded, thereby returning the signals $V_{INP\_COMP}$ and $V_{INM\_COMP}$ to the transconductance common mode, which is inside the bounds of $+/-V_C$.

Operation of the circuit of FIG. 8 will now be described in more detail with reference to FIGS. 9A and 9B.

Figure 9A:
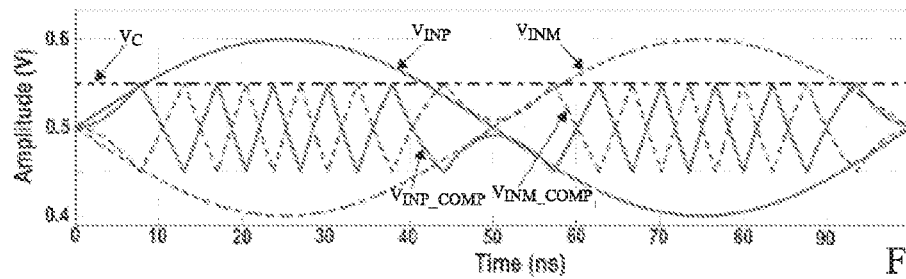
FIG. 9A is a timing diagram illustrating examples of signals in the circuit of FIG. 8.

FIG. 9A is a timing diagram illustrating examples of the amplitude in volts of the signals $V_C$, the input differential voltage signals $V_{INP}$ and $V_{INM}$, the output signals $V_{INP\_COMP}$ and $V_{INM\_COMP}$ at the positive and negative outputs of the transconductance circuit 804. As illustrated, in the example of FIG. 9A the signals $V_{INP}$ and $V_{INM}$ are differential sinusoidal signals.

The signal $V_{INP}$ is initially coupled to the positive input of the transconductance circuit 804, and the signal VINM is coupled to the negative input of the transconductance circuit 804. As the signal $V_{INP}$ rises, the signal $V_{INP\_COMP}$ also rises, until the threshold level $V_C$ is reached. This will cause a rising edge of the signal $COMP_1$ at the output of the comparator 808A, which in turn cause a transition of the signals S and $\overline{S}$.

Thus the signal $V_{INP}$ will be coupled to the negative input of the transconductance circuit 804, and the signal $V_{INM}$ will be coupled to the positive input of the amplifier. This will cause the signal $V_{INP\_COMP}$ to fall thereby bringing low the signal $COMP_1$. The signal VINM_COMP will also rise, until it reaches the threshold voltage $V_C$. This will cause the signal $COMP_2$ at the output of the comparator 808B to go high, thereby again switching the states of the signals S and $\overline{S}$, which will in turn cause the output of the comparator 808B to go low.

Figure 9B:
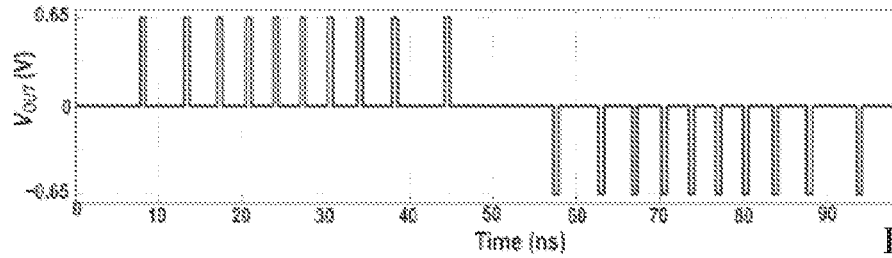
FIG. 9B is a timing diagram illustrating an example of an output signal of the circuit of FIG. 8.

FIG. 9B is a timing diagram illustrating examples of the output voltage $V_{OUT}$ of the converter 412. The sign correction circuit 810 renders positive the pulses generated while the signal $V_{INP}$ is positive, and negative the pulses generated while the signal $V_{INP}$ is negative. The pulses all for example have substantially the same pulse width. However, the time interval between each pulse is a function of the speed of integration by the integrators 806A, 806B, which is a function of the level of the input signal during the corresponding time periods.

Figure 10:
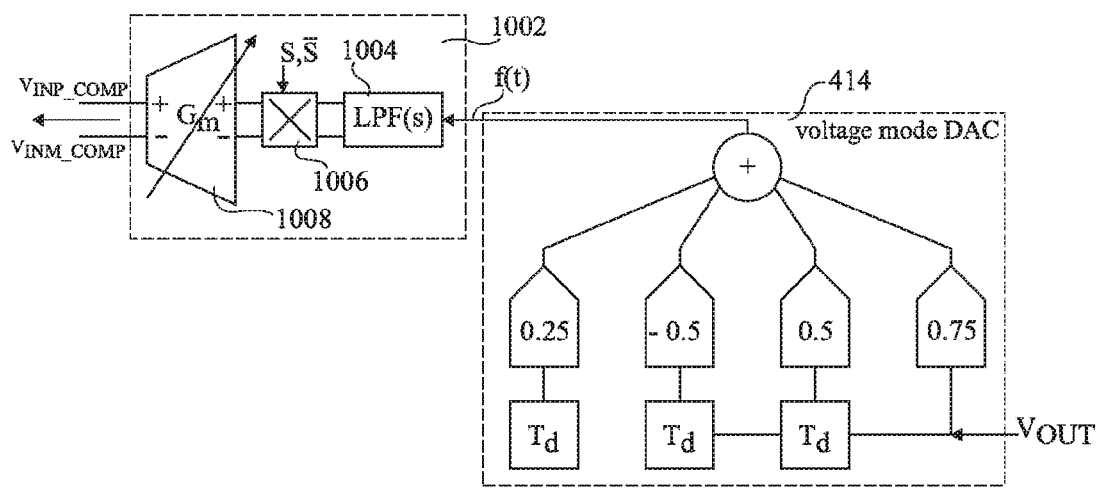
FIG. 10 schematically illustrates a feedback loop for use with the continuous-time ADC of FIG. 8 according to an example embodiment of the present disclosure.

FIG. 10 illustrates the CT digital filter 414, and a signal adaption circuit 1002, which for example forms part of the adder 410 of FIG. 4, and which adapts the feedback signal for the CT ADC embodiment of FIG. 8. The filter 414 is for example of the same type as the example of FIG. 7, and in FIG. 10 this filter also operates as a voltage mode DAC (digital to analog converter), for example by using analog components such as resistors and/or capacitors to apply the coefficients to the tap outputs and generate the feedback signal f(t).

The feedback signal f(t) is for example adapted by the circuit 1002 to generate signals of a form that may be added to the signals $V_{INP\_COMP}$ and $V_{INM\_COMP}$ on capacitors 806A and 806B respectively of the CT ADC 412 of FIG. 8. For example, the circuit 1002 comprises one or more low pass filters (LPF(s)) 1004, which remove high frequency components of the digital feedback signal f(t) and provide differential output signals. The outputs of the filter 1004 are for example coupled to a switching circuit 1006, which is for example the same as the circuit 802 of FIG. 8, and receives the signals S and $\overline{S}$ from the circuit 812. Thus the feedback signal is chopped in the same way as the input signals $V_{INP}$, $V_{INM}$.

The outputs of the switching circuit 1006 are provided to inputs of a differential transconductance circuit 1008, which for example has a variable gain, and which is for example similar to the device 804 of FIG. 8, and has its outputs coupled to the outputs $V_{INP\_COMP}$ and $V_{INM\_COMP}$ of the transconductance circuit 804. The transconductance circuit 1008 generates differential analog signals that are suitable for being added to the signals at the outputs of the transconductance circuit 804.

An advantage of the embodiments described herein is that, by using a filter in a feedback path to amplify frequencies of an output signal that are not within a desired signal bandwidth, interferers can be suppressed in a simple and efficient manner. For example, the embodiments described herein permit the interferers 204, 304 and 306 to be suppressed before the ADC. This has the advantage of reducing power consumption in the presence of strong interferers, as they will be suppressed and thus the ADC will generate fewer pulses and consume less power. Circuits positioned after the ADC, such as the block 416 in FIG. 4, will also consume less power.

An advantage of positioning the continuous time digital filter 414 in the feedback path of the CT ADC rather than before the CT ADC is that the filtering is performed in the digital domain rather than in the analog domain, and such a digital filter is tuneable.

Having thus described at least one illustrative embodiment, various alterations, modifications and improvements will readily occur to those skilled in the art.

For example, while a particular example implementation of an asynchronous continuous-time ADC has been described in relation with FIG. 8, this is merely one example, and numerous alternative implementations would be possible.

Furthermore, the various features described in relation with the various embodiments could be combined, in alternative embodiments, in any combination.

The invention claimed is:
1. An analog to digital conversion and filtering circuit comprising:
   an input for receiving an analog input signal;
   an asynchronous continuous-time analog to digital converter adapted to generate, based on the analog input signal, a digital continuous-time signal;
   a feedback path comprising a digital continuous-time filter adapted to generate a filtered signal to be combined with the analog input signal, the digital continuous-time filter being adapted to generate the filtered signal by:
- filtering out at least one first frequency range of the digital continuous-time signal; and
- amplifying at least one second frequency range of the digital continuous-time signal.

2. The circuit of claim 1, wherein the digital continuous-time filter is a digital continuous-time FIR (finite impulse response) filter.

3. The circuit of claim 1, wherein the first frequency range comprises a channel to be received.

4. The circuit of claim 3, wherein the digital continuous-time filter receives a channel selection signal indicating the channel to be received, wherein the digital continuous-time filter is adapted to have a variable frequency response in order to select the channel to be received.

5. The circuit of claim 1, wherein the digital continuous-time filter is a notch filter having a stop band equal to the first frequency range.

6. The circuit of claim 5, wherein the frequency range of stop band of the notch filter is variable.

7. The circuit of claim 1, wherein the digital continuous-time filter comprises at least one delay element for delaying the digital continuous-time signal to generate a plurality of signals of variable delay, and a plurality of elements for multiplying the plurality of signals of variable delay by corresponding coefficients.

8. The circuit of claim 1, wherein said input signal comprises first and second differential input signals, and wherein the asynchronous continuous-time analog to digital converter comprises:
- a first capacitor adapted to generate a first integrated signal by integrating the first input signal during a first phase and by integrating the second input signal during a second phase;
- a first comparator adapted to generate a first pulse when the first integrated signal passes a threshold level;
- a second capacitor adapted to generate a second integrated signal by integrating the second input signal during the first phase and by integrating the first input signal during a second phase;
- a second comparator adapted to generate a second pulse when the second integrated signal passes the threshold level; and
- a control circuit adapted to select the first or second phase based on a detection of the first or second transition.

9. The circuit of claim 8, wherein the asynchronous continuous-time analog to digital converter further comprises a differential transconductance circuit adapted to amplify the first and second differential input signals prior to the integration by the first and second integrators.

10. The circuit of claim 8, further comprising a signal adaptation circuit adapted to convert the digital feedback signal into first and second differential analog feedback signals, and to combine the differential analog feedback signals with the analog input signal by coupling the first differential analog feedback signal to the first capacitor and the second differential analog signal to the second capacitor during the first phase, and by coupling the second differential analog feedback signal to the first capacitor and the first differential analog signal to the second capacitor during the second phase.

11. The circuit of claim 8, further comprising a sign adjustment circuit adapted to apply a positive sign to the first and second pulses generated based on an integration of the first analog input signal and to apply a negative sign to the first and second pulses generated based on an integration of the second analog input signal.

12. The circuit of claim 1, wherein the filtered signal is a digital signal.

13. The circuit of claim 1, wherein the filtered signal is an analog signal, the digital continuous-time filter generating a digital filtered signal and comprising a digital to analog converter for converting the digital filtered signal into the analog filtered signal.

14. A method of analog to digital conversion comprising:
- receiving at an input of an analog to digital conversion circuit an analog input signal;
- generating, by an asynchronous continuous-time analog to digital converter based on the analog input signal, a digital continuous-time signal;
- generating, by a feedback path comprising a digital continuous-time filter, a filtered signal, wherein the filtered signal is generated by:
  - filtering out at least one first frequency range of the digital continuous-time signal; and
  - amplifying at least one second frequency range of the digital continuous-time signal; and
- combining the filtered signal with the analog input signal.

* * * * *